(12) United States Patent
Yu

(10) Patent No.: US 8,743,921 B2
(45) Date of Patent: Jun. 3, 2014

(54) LIGHT EMITTING MODULE AND THERMAL PROTECTION METHOD

(75) Inventor: Jiang Hong Yu, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 488 days.

(21) Appl. No.: 12/747,170

(22) PCT Filed: Dec. 10, 2008

(86) PCT No.: PCT/IB2008/055190
§ 371 (c)(1),
(2), (4) Date: Jun. 10, 2010

(87) PCT Pub. No.: WO2009/077932
PCT Pub. Date: Jun. 25, 2009

(65) Prior Publication Data
US 2010/0260221 A1    Oct. 14, 2010

(30) Foreign Application Priority Data
Dec. 17, 2007  (EP) .................................. 07123317

(51) Int. Cl.
*H01S 3/03* (2006.01)
(52) U.S. Cl.
USPC .......................................... 372/34; 372/38.03
(58) Field of Classification Search
USPC ................................................ 372/34, 38.03
See application file for complete search history.

(56) References Cited

U.S. PATENT DOCUMENTS

| 7,269,192 | B2 * | 9/2007 | Hayashi ........................ 372/34 |
| 7,847,486 | B2 | 12/2010 | Ng | |
| 2002/0191393 | A1 | 12/2002 | Chen | |
| 2006/0214181 | A1 | 9/2006 | Lim et al. | |
| 2007/0139928 | A1 * | 6/2007 | Wang et al. .................. 362/276 |
| 2007/0200512 | A1 | 8/2007 | Gotou et al. | |
| 2009/0021185 | A1 * | 1/2009 | Ng .............................. 315/294 |

FOREIGN PATENT DOCUMENTS

| IL | 87526 A | 11/1990 | |
| JP | 2002009343 A | * 1/2002 | ............. H01L 33/00 |
| JP | 2006060165 A | 3/2006 | |
| WO | 2006019897 A2 | 2/2006 | |
| WO | 2007097483 A1 | 8/2007 | |

* cited by examiner

Primary Examiner — Kinam Park

(57) ABSTRACT

Proposed is a light emitting module (1), comprising a semiconductor light emitting device (10) and a thermal switch (20). The thermal switch (20) is arranged to protect the device (10) from over heating. At elevated temperatures the junction of the device (10) may reach a critical level causing catastrophic breakdown of the device. According to the invention, the thermal switch is arranged to shunt the semiconductor light emitting device. This is especially advantageous as the thermal protection offered by the switch (20) correlates directly to the (junction) temperature of the device (10).

20 Claims, 3 Drawing Sheets

LIGHT EMITTING MODULE AND THERMAL PROTECTION METHOD

FIELD OF THE INVENTION

The invention relates to a light emitting module. More specifically the invention relates to a module comprising a semiconductor light emitting device and a thermal switch. Moreover, it relates to a thermal protection method of such light emitting modules.

BACKGROUND OF THE INVENTION

An embodiment of a light emitting module of the kind set forth is known from JP2006060165. That document discloses a light emitting device comprising a LED electrically connected in series with a bimetal element. Connecting this device to an external power supply causes the LED to blink. This effect results from a repeated heating and cooling cycle of the bimetal element as energy dissipates into it when a current flows through the device and dissipates from it when the circuit is open.

The repeated opening and closing of the circuit through the action of the bimetal element may protect the LED from overheating, and thus from a catastrophic failure if the junction temperature would reach a critical level.

Disrupting the current running through the LED in JP2006060165, however, clearly does not primarily depend on the (junction) temperature of the LED. In fact, the main driver for the functionality of the bimetal element is the resistive electrical energy dissipation in the element itself. Hence, it does not provide a thermal protection well tuned and correlated to the junction temperature of the LED itself.

SUMMARY OF THE INVENTION

It is an object of the invention to provide a light emitting module of the kind set forth which provides a thermal protection tuned and correlated to the junction temperature of a semiconductor light emitting device. A light emitting module in an embodiment of this invention includes a semiconductor light emitting device and a thermal switch, characterized in that the thermal switch is arranged to shunt the semiconductor light emitting device.

In electronics, a shunt allows electrical currents to pass around a point in the circuit. Assembling the shunt in parallel to the point in the circuit achieves this. Also the thermal switch in the invention is arranged electrically parallel to a light emitting diode or laser diode. Advantageously, no electrical energy dissipates in the thermal switch directly under operational conditions. Instead, under these conditions the (junction of) the semiconductor light emitting device heats up due to the non-ideal conversion of electrical energy into light. Assembling the thermal switch adjacent to (or at least in the close vicinity of) the device beneficially results in the latter heating up the former, either through radiative energy transfer or through conductive energy transfer via the constructional elements of the module. Consequently and advantageously, the thermal protection offered by the switch correlates directly to the (junction) temperature of the semiconductor device. In addition, when coupling a multitude of modules in a series string, the invention allows protecting a single module form overheating without interrupting the current flow through the other modules in the string.

In an embodiment the thermal switch is arranged to operate at a predetermined shunt temperature protecting the junction from reaching a critical temperature under operating conditions. Advantageously, this allows shutting off the current supplied to the module before the catastrophic damage occurs.

In an embodiment of the invention the thermal switch comprises a high coefficient of thermal expansion (HCTE) material with a coefficient of thermal expansion $\alpha_h$ and a low coefficient of thermal expansion (LCTE) material with a coefficient of thermal expansion $\alpha_l$, and $\alpha_h > \alpha_l$. Advantageously, this allows the switch to geometrically deform, causing the switch to close and thus shutting off the current supply to the semiconductor device.

In an embodiment, the HCTE material comprises a metal and the LCTE material comprises a ceramic. Advantageously, these material types can be easily assembled with the usual fabrication methods known in the art. Typically, metals have a larger coefficient than ceramics. For instance, the coefficient of thermal expansion of some useful metals: Cu~$18 \cdot 10^{-6}/°$C., Al~$24 \cdot 10^{-6}/°$C., and MnPd (typically 80%/20%, with Ni traces added for stiffness) alloys ~$30 \cdot 10^{-6}/°$C. Similarly, the coefficient of some useful ceramics: $Si_3N_4$ ~$3 \cdot 10^{-6}/°$C., AlN~$4 \cdot 10^{-6}/°$C., and $Al_2O_3$ ~$8 \cdot 10^{-6}/°$C.

According to an embodiment of the invention the thermal switch comprises a bimetallic element. Advantageously, such elements are readily available and very economical.

In an embodiment of the light emitting module according to the invention the HCTE material is provided in two parts, the parts arranged at a distance from each other forming a gap. Advantageously, this allows electrically connecting the first part of the HCTE material to the n-side of the semiconductor device and the second part to the p-side.

In an embodiment of the invention the gap is arranged to have a predetermined size defining a shunt temperature. Advantageously, the coefficient of thermal expansion allows determining the temperature rise necessary for the two parts to bridge the gap. The design of the module (materials, geometrical form factor, etc) will induce a fixed relation between the temperature rise of the junction and of the thermal switch. Hence, the gap size can readily be designed to be bridged at protective shunt temperature levels consistent with the thermal capabilities of the junction.

According to a second aspect the invention provides a method to protect a semiconductor light emitting device from overheating comprising the steps providing a semiconductor light emitting device having a junction, providing a thermal switch characterized by shunting the semiconductor light emitting device with the thermal switch. Advantageously, such a method may be used in controlling and testing the thermal design of a light emitting module comprising the semiconductor light emitting device.

These and other aspects of the invention will be apparent from and elucidated with reference to the embodiments described hereinafter.

BRIEF DESCRIPTION OF THE DRAWINGS

Further details, features and advantages of the invention are disclosed in the following description of exemplary and preferred embodiments in connection with the drawings.

DETAILED DESCRIPTION OF THE EMBODIMENTS

Figure 1:
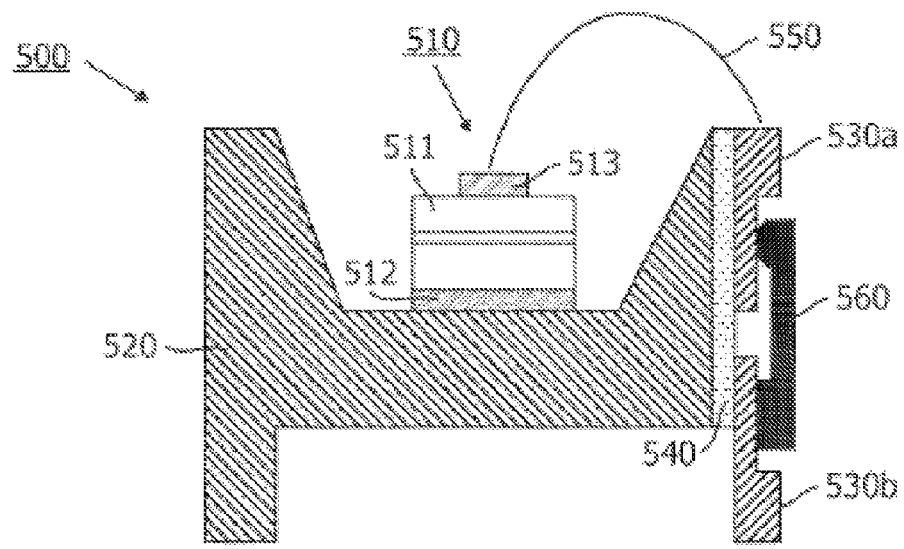
FIG. 1 shows a light emitting module according to the prior art.

FIG. 1 shows a light emitting module 500 according to the prior art. The module comprises a LED 510 positioned in the cup of a first lead frame part 520. Furthermore the module comprises second lead frame parts 530$a,b$, separated from the first part by isolation 540. The LED 510 has an epitaxial package 511 comprising an n-type and a p-type semiconductor layer sandwiching a diode junction. The n-contact layer 512 connects the LED 510 with the first lead frame part 520, while the p-contact layer 513 and the bond wire 550 connect the LED with the second lead frame part 530$a$. The first 520 and second 530$b$ lead frame parts provide the connections to an electrical power source. Finally, the module comprises a bimetallic element 560 assembled in series with the LED 510. Providing a current through the module results in light emission from the LED as well as energy dissipation in the electrically resistive bimetallic element 560 arranged to open the electrical circuit once it reaches a temperature predetermined by the design of the element. When open, the LED stops emitting light and the bimetallic element cools down. As a result it closes the circuit, allowing the current to flow through the module and to restart the cycle. Consequently, the LED will display an automatic blinking effect. As the main driver for the functionality of the bimetal element 560 is the resistive electrical energy dissipation in the element itself, clearly the disruption of the electrical circuit does not primarily depend on the (junction) temperature of the LED itself.

Figure 2:
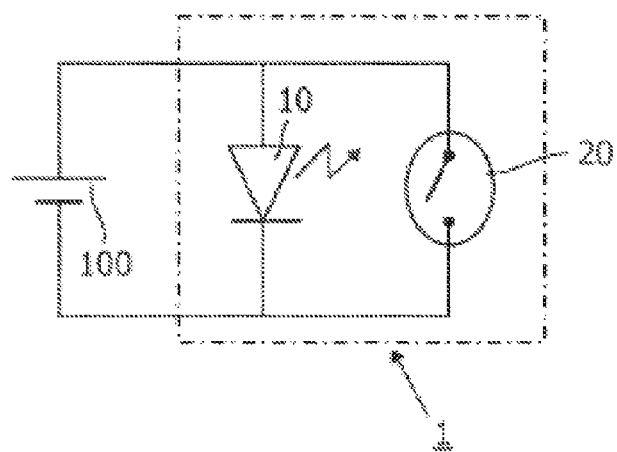
FIG. 2 shows a schematic representation of an embodiment according to the invention.

FIG. 2 shows a schematic representation of an embodiment according to the invention. It shows a light emitting module 1 connected to an external power supply 100. The module comprises a semiconductor light emitting device 10—indicated as a LED in the remainder, however, it will be understood that a laser diode functions as well—and a thermal switch 20. The LED comprises an epitaxial package (fabricated as known in the art) including a junction arranged to emit light of a predetermined wavelength. The thermal switch shunts the LED. Advantageously, no electrical energy dissipates in the thermal switch 20 directly under operational conditions. In fact, the LED 10 functions as the heat source for the operation of the thermal switch 20. Thus, positioning the thermal switch 20 adjacent to the LED 10 allows the former to be heated by the latter, either through radiative energy transfer or through conductive energy transfer via the constructional elements (not shown) of the module 1. Consequently, the thermal protection offered by the thermal switch 20 correlates directly to the (junction) temperature of the LED 10. Obviously, the switch does not operate at the same temperature as the junction of the LED 10 it has to protect. Geometrical factors of the light emitting module 1 design determine the temperature difference between the junction and the thermal switch 20. Hence, the switch can be arranged or calibrated to operate at a predetermined shunt temperature well below the critical junction temperature. Advantageously, this allows protecting the LED 10 against reaching a critical junction temperature, and hence against catastrophic breakdown under operating conditions. Once the thermal switch 20 closes, the current passes around the LED 10 resulting in it to cool off. The diminished heat dissipation in the LED 10 will in turn cause the thermal switch 20 to cool off and reopen. This allows stabilization of the temperature of the LED 10 in the module 1.

Figure 3:
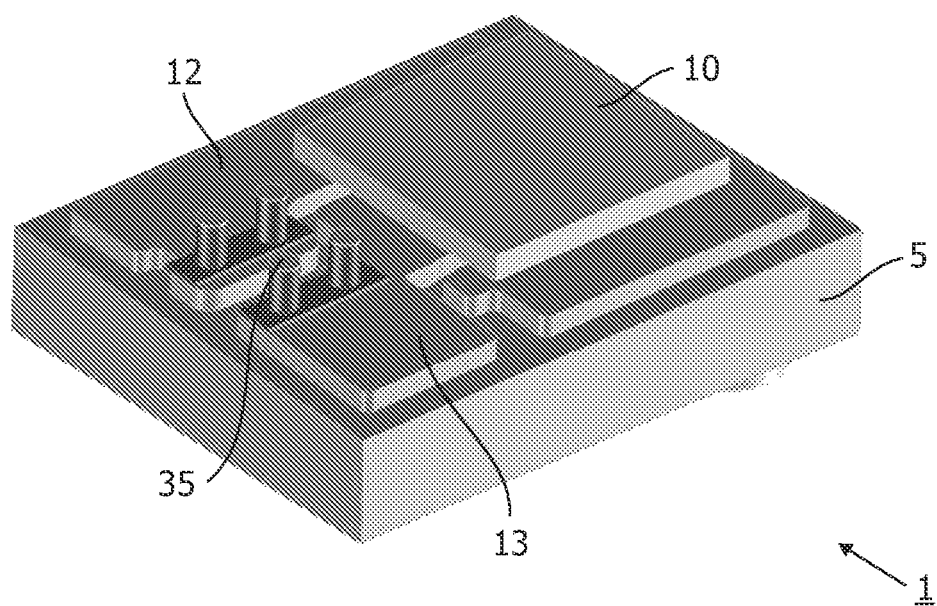
FIGS. 3-5 show fabrication steps of an embodiment according to the invention.
Figure 4:
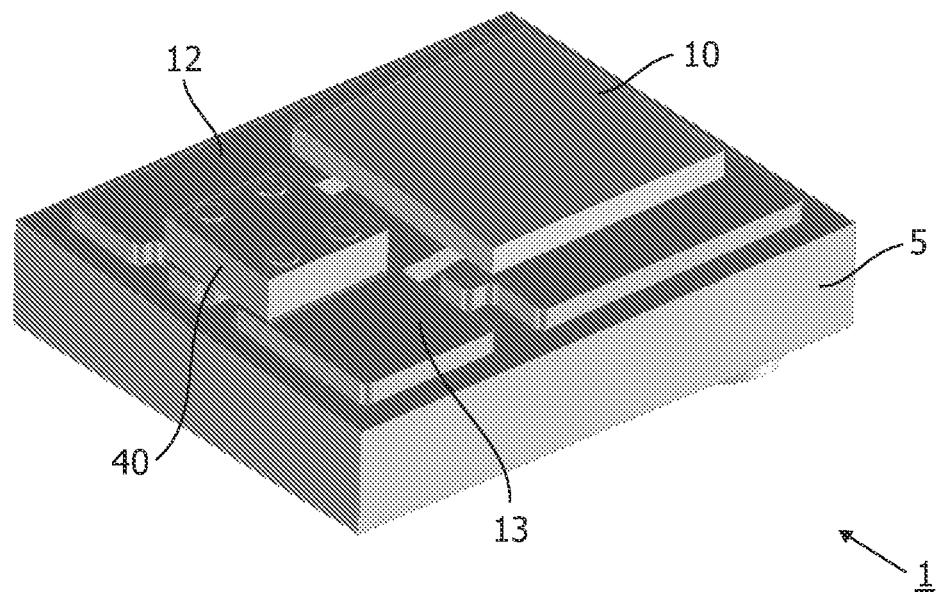
Figure 5:
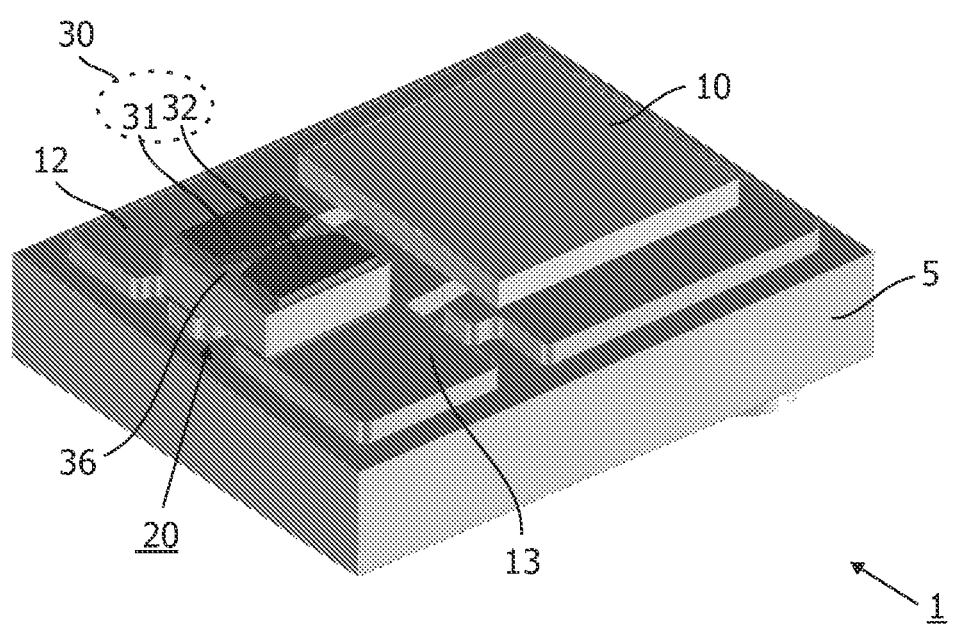

FIGS. 3-5 show fabrication steps of an embodiment according to the invention. Starting with FIG. 3, it shows the light emitting module 1 comprising a substrate 5. On top of the substrate 5 patterns 12, 13 have been deposited for electrically contacting the n and p side of the LED 10. At a location adjacent to the LED 10, the module 1 comprises the thermal switch 20. In an embodiment the switch 20 comprises a HCTE material 30 (FIG. 5) and a LCTE material 40 (FIG. 4). The HCTE material 30 has a coefficient of thermal expansion $\alpha_h$. Similarly, the LCTE material 40 has a coefficient of thermal expansion $\alpha_l$. The relation $\alpha_h > \alpha_l$ holds. The LCTE material 40 beneficially comprises a ceramic, such as $Si_3N_4$, $Al_2O_3$, or AlN, where as the HCTE material 30 comprises a metal, such as copper, aluminium, or MnPd alloys. Advantageously, these materials types can be easily assembled with the usual fabrication methods used for the fabrication of semiconductor light emitting devices. In an embodiment, vias 35 (FIG. 3) through the LCTE material 40 connect the HCTE material 30 with the patterns 12, 13. The LCTE material 40 also functions as an electrical insulator.

In an embodiment, the HCTE material 30 comprises two parts 31, 32 (FIG. 5). Beneficially, arranging these parts at a small distance to each other on top of the LCTE material 40 creates a gap 36 between them. In an embodiment, the gap 36 has a predetermined size. Advantageously, this allows defining the shunt temperature. A temperature rise $\Delta T$ equal to the shunt temperature induces the thermal switch 20 to close if the gap size d equals $d = \alpha_h \cdot \Delta T$.

The method to protect a semiconductor light emitting device 10 according to the invention can effectively be applied in testing thermal designs of lighting assemblies comprising modules 1. While presently expensive and error prone methods are used, such as transient testers and IR imaging, to check the thermal design, application of the inventive method relieves many problems in this area. First of all, the known methods become obsolete since the inventive method directly reveals to the naked eye if a critical design temperature has been reached in the lighting assembly, respectively, the light emitting module 1. After all, at reaching the critical temperature limit the LED 10 will extinguish. Secondly, the light emitting modules 1 according to the invention can be mass fabricated at low cost. Thirdly, the modules 1 can be designed to function at a predetermined temperature level. These advantages make the modules a very versatile tool for a wide range of applications and temperatures.

Although the invention has been elucidated with reference to the embodiments described above, it will be evident that alternative embodiments may be used to achieve the same objective. The scope of the invention is therefore not limited to the embodiments described above. For instance, alternatively to the thermal switch 20 described above it may comprise a bimetal element.

Accordingly, the spirit and scope of the invention is to be limited only by the claims and their equivalents.

The invention claimed is:

1. A light emitting module comprising:
   a semiconductor light emitting device having a junction, and
   a thermal switch device having two terminals and two states: a conducting state that effectively creates a short circuit between the two terminals and a non-conducting state that effectively creates an open circuit between the two terminals, wherein:
   the thermal switch device is arranged in parallel with, and in thermal contact with, the light emitting device and is configured to enter the conducting state at and above a predetermined shunt temperature, protecting the junction from reaching a critical, higher temperature under operating conditions, and
   the thermal switch device comprises a HCTE (High Coefficient of Thermal Expansion) material with a coefficient of thermal expansion αh and a LCTE (Low Coefficient of Thermal Expansion) material with a coefficient of thermal expansion αl, and αh>αl.

2. The light emitting module of claim 1, wherein the HCTE material comprises a metal and the LCTE material comprises a ceramic.

3. The light emitting module of claim 1, wherein the thermal switch device comprises a bimetallic element.

4. The light emitting module of claim 1, wherein the HCTE material is provided in two parts, the parts arranged at a distance from each other forming a gap.

5. The light emitting module of claim 4, wherein the gap is arranged to have a predetermined size based on the shunt temperature.

6. The light emitting module of claim 1, wherein the thermal switch device is positioned adjacent to the semiconductor light emitting device.

7. The light emitting module of claim 1, wherein the semiconductor light emitting device comprises a light emitting diode or a laser diode.

8. The method of claim 1, including fabricating conductive patterns on a common substrate to contact n and p regions of the light emitting device; wherein the thermal switch device is coupled to these conductive patterns.

9. A method to protect a semiconductor light emitting device from overheating comprising:
providing the semiconductor light emitting device having a junction;
providing a thermal switch device having two terminals and two states; a conducting state that effectively creates a short circuit between the two terminals and a non-conducting state that effectively creates an open circuit between the two terminals,
coupling the thermal switch device in parallel and in thermal contact with the light emitting device, and
fabricating the light emitting device and the thermal switch device on a common substrate
wherein the thermal switch device is configured to enter the conducting state at and above a predetermined shunt temperature, protecting the junction from reaching a critical, higher temperature under operating conditions, and
providing the thermal switch device includes fabricating a first conductive element and a second conductive element on a surface, and a distance between the first and second conductive elements determines a switching point of the thermal switch device to and from the conducting state.

10. A method to protect a semiconductor light emitting device from overheating comprising:
providing the semiconductor light emitting device having a junction;
providing a thermal switch device having two terminals and two states; a conducting state that effectively creates a short circuit between the two terminals and a non-conducting state that effectively creates an open circuit between the two terminals, and
coupling the thermal switch device in parallel and in thermal contact with the light emitting device,
wherein the thermal switch device is configured to enter the conducting state at and above a predetermined shunt temperature, protecting the junction from reaching a critical, higher temperature under operating conditions, and
the thermal switch device comprises a HCTE material with a coefficient of thermal expansion $\alpha h$ and a LCTE material with a coefficient of thermal expansion $\alpha l$, and $\alpha h > \alpha l$.

11. The method of claim 10, wherein the HCTE material comprises a metal and the LCTE material comprises a ceramic.

12. The method of claim 10, wherein the thermal switch device comprises a bimetallic element.

13. The light emitting module of claim 1, wherein the thermal switch device is positioned adjacent to the semiconductor light emitting device.

14. The light emitting module of claim 2, wherein the thermal switch device is positioned adjacent to the semiconductor light emitting device.

15. The light emitting module of claim 4, wherein the thermal switch device is positioned adjacent to the semiconductor light emitting device.

16. The light emitting module of claim 2, wherein the HCTE material is provided in two parts, the parts arranged at a distance from each other forming a gap of a predetermined size based on the shunt temperature.

17. The light emitting module of claim 3, wherein the HCTE material is provided in two parts, the parts arranged at a distance from each other forming a gap of a predetermined size based on the shunt temperature.

18. The method of claim 10, including fabricating conductive patterns on a common substrate to contact n and p regions of the light emitting device; wherein the thermal switch device is coupled to these conductive patterns.

19. The method of claim 9, wherein the thermal switch device comprises a bimetallic element.

20. The method of claim 9, wherein the thermal switch device comprises a HCTE material with a coefficient of thermal expansion $\alpha h$ and a LCTE material with a coefficient of thermal expansion d, and $\alpha h > \alpha l$.

* * * * *